(12) United States Patent
Lin et al.

(10) Patent No.: US 11,289,875 B2
(45) Date of Patent: Mar. 29, 2022

(54) TEMPERATURE CONTROL DEVICE WITH A PLURALITY OF ELECTRICALLY CONDUCTIVE TERMINALS, AND AN OPTICAL SUBASSEMBLY MODULE IMPLEMENTING SAME

(71) Applicant: Applied Optoelectronics, Inc., Sugar Land, TX (US)

(72) Inventors: Kai-Sheng Lin, Sugar Land, TX (US); Hang Xie, Missouri City, TX (US); Ming Qi, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 233 days.

(21) Appl. No.: 16/693,365

(22) Filed: Nov. 24, 2019

(65) Prior Publication Data

US 2021/0159666 A1  May 27, 2021

(51) Int. Cl.
| | |
|---|---|
| *H01S 5/0233* | (2021.01) |
| *H01S 5/02212* | (2021.01) |
| *H04B 10/40* | (2013.01) |
| *H01S 5/024* | (2006.01) |
| *H01S 5/023* | (2021.01) |
| *H01S 5/0235* | (2021.01) |
| *F21V 8/00* | (2006.01) |

(52) U.S. Cl.
CPC ......... *H01S 5/02476* (2013.01); *H01S 5/023* (2021.01); *H01S 5/0233* (2021.01); *H01S 5/0235* (2021.01); *G02B 6/0066* (2013.01); *H01S 5/02212* (2013.01); *H04B 10/40* (2013.01)

(58) Field of Classification Search
CPC .................................................... H01S 5/0653
USPC .......................................... 372/45.01, 38.05
See application file for complete search history.

(56) References Cited

U.S. PATENT DOCUMENTS

| | | | |
|---|---|---|---|
| 7,298,937 B2* | 11/2007 | Keh .................... | H01S 5/02212 385/14 |
| 2005/0207459 A1* | 9/2005 | Yu ....................... | H01S 5/02212 372/36 |
| 2017/0207606 A1* | 7/2017 | Nakanishi .......... | H01S 5/32316 |

* cited by examiner

*Primary Examiner* — Tuan N Nguyen
(74) *Attorney, Agent, or Firm* — Grossman Tucker Perreault & Pfleger, PLLC; Norman S. Kinsella

(57) ABSTRACT

In general, a temperature control device for use in laser assemblies and optical subassemblies is disclosed that includes at least two electrically conductive terminals to enable flexible electrical coupling to associated components, e.g., monitor photodiodes and laser diodes, and accommodate a range of laser assembly configurations without the necessity of supplying a negative voltage rail. In more detail, a temperature control device consistent with the present disclosure includes a bottom plate, a top plate, and a plurality of semiconductor elements disposed therebetween. The top plate includes a component mounting surface that provides at least a first and second electrically conductive terminal/pad. The first and second electrically conductive terminals/pads can be electrically isolated, e.g., via a gap, and configured to provide first and second voltage potentials respectively.

18 Claims, 5 Drawing Sheets

TEMPERATURE CONTROL DEVICE WITH A PLURALITY OF ELECTRICALLY CONDUCTIVE TERMINALS, AND AN OPTICAL SUBASSEMBLY MODULE IMPLEMENTING SAME

TECHNICAL FIELD

The present disclosure relates to optical communication devices, and more particularly, to a temperature control device for use in an optical subassembly having two or more electrically conductive terminals to couple to associated components and selectively provide the same or different voltage potentials.

BACKGROUND

Optical transceivers are used to transmit and receive optical signals for various application including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules has presented challenges, for example, with respect to space management and manufacturing yield.

Optical transceiver modules generally include one or more transmitter optical subassemblies (TOSAs) for transmitting optical signals and one or more receiver optical subassemblies (ROSAs) for receiving optical signals. In general, TOSAs include one or more lasers to emit one or more channel wavelengths and associated circuitry for driving the lasers and monitoring power to ensure nominal performance. Optical power monitoring in TOSAs can include disposing an MPD adjacent an associated laser diode to receive a portion of light, e.g., 1%, and measure optical power. However, continued scaling and increased channel density presents numerous technical challenges that complicates MPD placement, orientation, and electrical interconnection.

BRIEF DESCRIPTION OF THE DRAWINGS

These and other features and advantages will be better understood by reading the following detailed description, taken together with the drawings wherein.

DETAILED DESCRIPTION

Figure 1B:
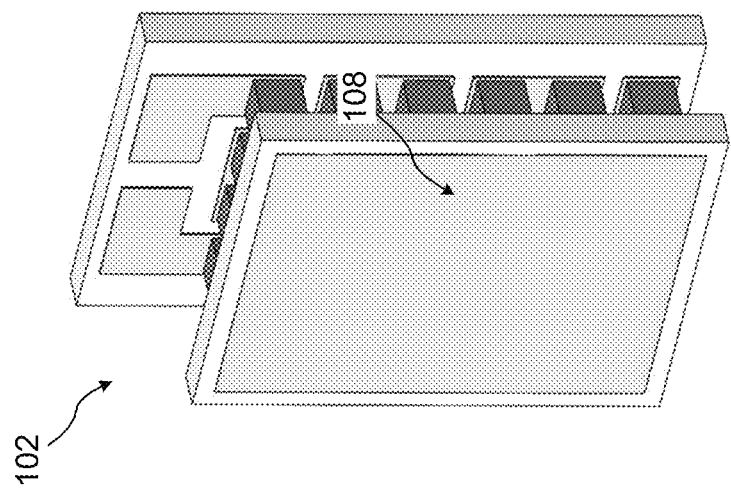
FIG. 1B shows the temperature control device of FIG. 1A in isolation.
Figure 1A:
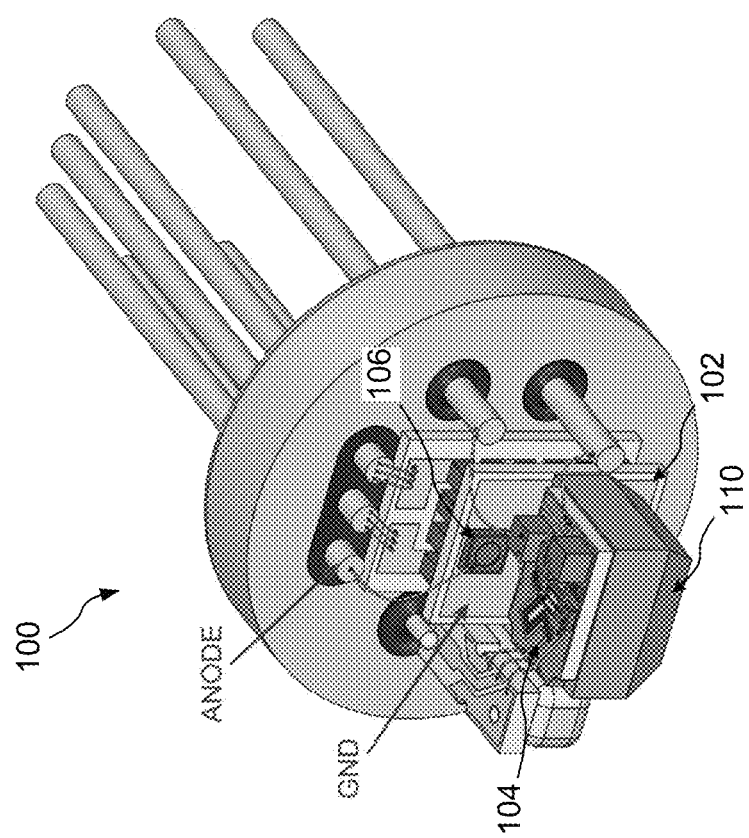
FIG. 1A shows an example TO-can laser assembly implemented with an EML-type laser arrangement disposed on a temperature control device.

As discussed above, scaling of optical modules and subassemblies complicates the design and implementation of MPD arrangements. Such challenges can be better understood by way of example. FIG. 1A shows an example TO can laser 100 having an electro-absorption modulate laser (EML) arrangement 104 and associate MPD 106. EML lasers are particularly well suited for long-distance optical transmissions, e.g., up to and beyond 10 kilometers. However, maintaining nominal performance using EML lasers depends in large part on regulating operating temperatures. Temperature control devices such as thermoelectric coolers (TECs) can be utilized to maintain target temperatures.

As shown in FIG. 1A, the TO can laser 100 includes a TEC 102 with the EML arrangement 104 disposed thereon. In addition, an MPD 106 is mounted to the TEC 102 and is optically aligned to receive at least a portion of emitted channel wavelengths from the EML arrangement 104. Proper design of the MPD 106 and interconnecting circuitry includes having a lower voltage potential supplied at the anode terminal of the MPD 106 relative to the cathode terminal. As shown, the electrically conductive pad 108 (see FIG. 1B) of the TEC supplies a ground connection (e.g., 0 volts) to the cathode terminal of the MPD 106 and to the submount 110 that electrically communicates with the components of the EML arrangement 104. The anode terminal of the MPD 106 thus gets a negative voltage from, for instance, external circuitry. However, providing such a negative voltage can substantially increase design complexity as many optical modules include power rails that supply positive voltage, e.g., 3.3 volts, 5 volts, 12 volts, 24 volts. Circuitry to step down and supply a negative voltage to the MPD 106 introduces substantial costs and design complexity, and inclusion of such circuitry can be impractical given factors such as space constraints.

Thus, in accordance with an embodiment, a temperature control device for use in laser assemblies and other optical subassemblies is disclosed that includes at least two electrically conductive terminals to enable flexible electrical coupling to associated components, e.g., monitor photodiodes and laser diodes, to accommodate a range of laser assembly configurations without the necessity of supplying a negative voltage rail. In more detail, a temperature control device consistent with the present disclosure includes a bottom plate, a top plate, and a plurality of semiconductor elements disposed therebetween. The top plate includes a component mounting surface that provides at least first and second electrically conductive terminals/pads. The first and second electrically conductive terminals/pads can be electrically isolated, e.g., via a gap, and configured to provide first and second voltage potentials, respectively, with the first and second voltage potentials being different. Alternatively, the first and second electrically conductive terminals/pads can be electrically coupled together, e.g., via a wire bond, to provide a single common voltage potential.

Thus, a temperature control device consistent with the present disclosure can be utilized in a wide-range of laser assembly configurations by providing one or more different voltage potentials. External power and driving circuitry, e.g., within an optical subassembly module such as a transmitter optical subassembly (TOSA), can be implemented without the necessity of additional circuitry such as a negative voltage power rail to ensure proper operation of an MPD, for example. This significantly reduces design complexity and overall footprint of circuitry within an associated optical subassembly to drive a laser assembly.

While examples and scenarios discussed herein illustrate and discuss TO-can type laser assemblies, this disclosure is not limited in this regard. Likewise, while an EML-type laser arrangement is shown and described herein, other laser types are also within the scope of this disclosure.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. This disclosure is equally applicable to coarse wavelength division multiplexing (CWDM). In one specific example embodiment, the channel wavelengths are implemented in accordance with local area network (LAN) wavelength division multiplexing (WDM), which may also be referred to as LWDM.

The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated characteristic. To provide one non-limiting numerical example to quantify "substantially," minor variation may cause a deviation of up to and including ±5% from a particular stated quality/characteristic unless otherwise provided by the present disclosure.

Figure 2:
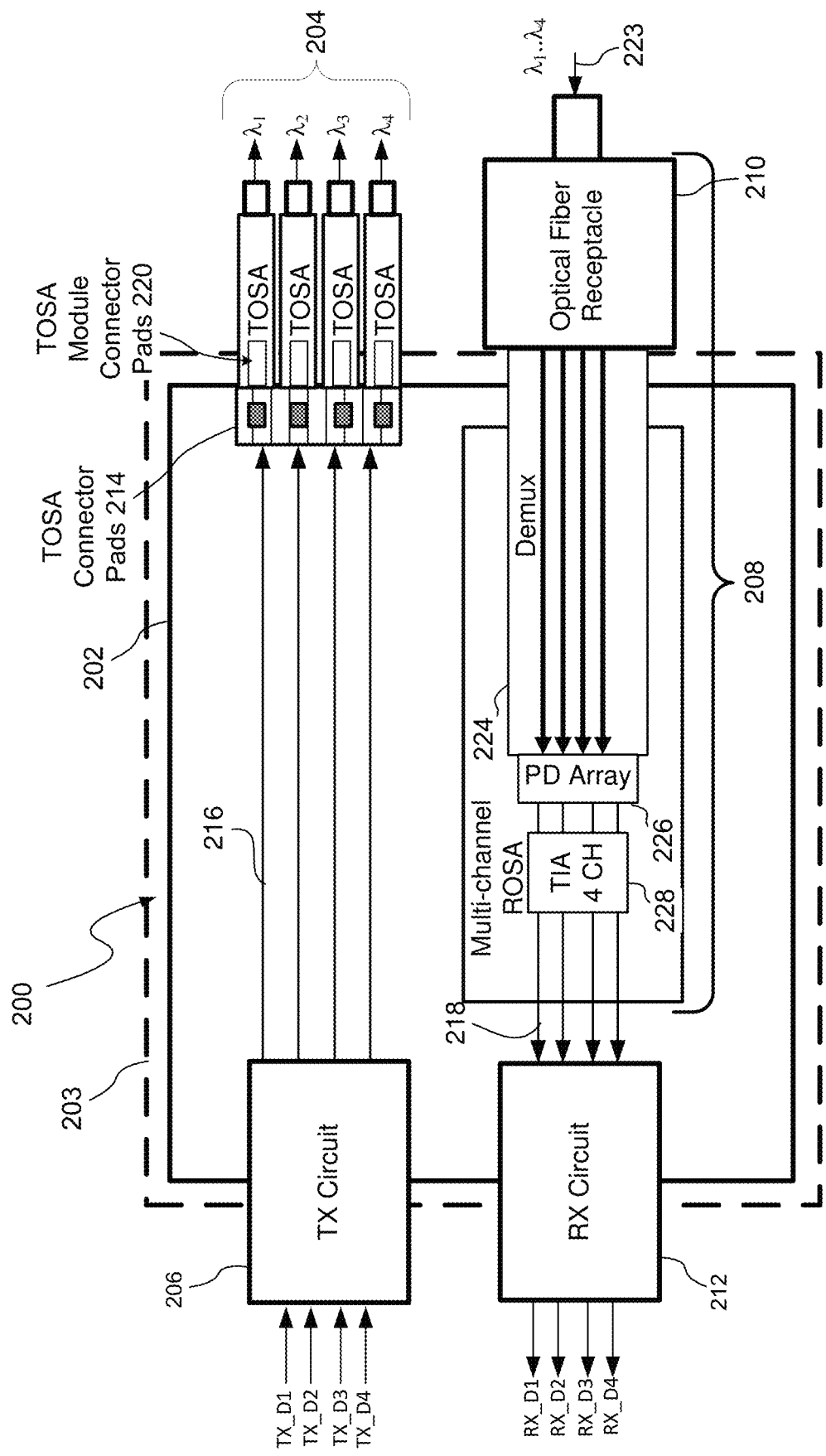
FIG. 2 shows a block diagram of an example multichannel optical transceiver module in accordance with an embodiment of the present disclosure.

Turning to the Figures, FIG. 2 illustrates an optical transceiver module 200, consistent with embodiments of the present disclosure. The optical transceiver module 200 is shown in a highly simplified form for clarity and ease of explanation and not for purposes of limitation. In this embodiment, the optical transceiver module 200 can be pluggable (e.g., comports with pluggable small form factor (SFFP) standards) and transmits and receives four (4) channels using four different channel wavelengths ($\lambda 1$, $\lambda 2$, $\lambda 3$, $\lambda 4$) and may be capable of transmission rates of at least about 25 Gbps per channel. In one example, the channel wavelengths $\lambda 1$, $\lambda 2$, $\lambda 3$, $\lambda 4$ may be within a ±13 nm range and have respective channel wavelengths of 1270 nm, 1290 nm, 1310 nm, and 1330 nm, respectively. Other channel wavelengths and configurations are within the scope of this disclosure including those associated with local area network (LAN) wavelength division multiplexing (WDM). For instance, the optical transceiver module 200 can include up to eight (8) or more channels and provide transmission rates of at least 25 Gbps per channel. Note, the present disclosure is equally applicable to other types of optical subassembly modules and optical devices such as single and multi-channel optical transmitters, and single and multi-channel optical receivers.

The optical transceiver module 200 may also be capable of transmission distances of 2 km to at least about 10 km. The optical transceiver module 200 may be used, for example, in internet data center applications or fiber to the home (FTTH) applications.

In an embodiment, the optical transceiver module 200 is disposed in a transceiver housing 203. The transceiver housing 203 can be configured with one or more cavities to receive one or more optical transceiver modules, depending on a desired configuration.

The optical transceiver module 200 includes a number of components to support transceiver operations. As shown, the optical transceiver module 200 includes an optical transceiver substrate 202, a plurality of transmitter optical subassemblies (TOSA) modules 204 for transmitting optical signals having different channel wavelengths, a transmit connecting circuit 206, a multi-channel receiver optical subassembly (ROSA) arrangement 208 for receiving optical signals on different channel wavelengths, an optical fiber receptacle 210 to receive and align a fiber connector (e.g., a ferrule) with the ROSA, and a receiver connecting circuit 212. Note, an external multiplexing device (not shown), e.g., an arrayed waveguide grating (AWG), can receive channel wavelengths emitted by the TOSA modules ($\lambda_1 \ldots \lambda_4$) and multiplex the same into a transmit signal, e.g., a wavelength-division multiplex (WDM) signal. However, the optical transceiver module 200 can include a local multiplexing device, e.g., an AWG mounted on the optical transceiver substrate 202, for outputting an optical signal with multiple channel wavelengths. The particular configuration of the optical transceiver module 200 shown in FIG. 2 is not intended to be limiting.

Continuing on, the optical transceiver substrate 202 includes traces, connector pads, and other circuitry to support transceiver operations. The optical transceiver substrate 202 may include TOSA connector pads 214 (or terminals 214) that enable each of the TOSA modules 204 to mount and electrically couple to the optical transceiver substrate 202. The TOSA connector pads 214 may also be referred to herein as a simply connector pads. The optical transceiver substrate 202 may include traces 216 that couple the TOSA connector pads 214 to the transmit connecting circuit 206. As discussed in greater detail below, the TOSA connector pads 214 can electrically couple to TO can laser packages and provide driving signals to the same, as discussed in greater detail below.

The ROSA arrangement includes an optical fiber receptacle 210, demultiplexing device 224, photodiode (PD) array 226, and a transimpedance amplifier (TIA) 228. The optical transceiver substrate 202 can include traces 218 that electrically couple the ROSA arrangement 208 to the receiver connecting circuit 212. The ROSA arrangement can receive a multiplexed input signal 223 via the optical fiber receptacle 210. The demultiplexer includes an input aligned with the optical fiber receptacle to receive the multiplex input signal. The demultiplexing device 224 separates the multiplexed input signal into constituent wavelengths and outputs each separated channel wavelength via a corresponding output onto PD array 226. The PD array 226 outputs electrical signals proportional to detected wavelengths. The TIA 228 receives the outputted electrical signals from the PD array 226 and filters and/or amplifies the same. The TIA 228 outputs the amplified signals to the receive connecting circuit 212 by way of traces 218.

The optical transceiver substrate 202 may provide an optical transceiver module that may be "plugged" into an optical transceiver cage. Therefore, the transmit connecting circuit 206 and the receiver connecting circuit 212 may electrically couple to external circuitry of the optical transceiver cage. The optical transceiver substrate 202 may be manufactured from a multi-layer printed circuitry board (PCB), although other types of substrates may be utilized and are within the scope of this disclosure.

Each of the TOSA modules 204 may be configured to receive driving electrical signals (TX_D1 to TX_D4) and emit associated channel wavelengths. The emitted channel wavelengths ($\lambda 1 \ldots \lambda n$) can then be output to a multiplexer (not shown) to multiplex the same into a signal transmit signal. Each of the TOSA modules 204 may be electrically coupled to the TOSA connector pads 214 and to the traces 216 through TOSA module connector pads 220. Each of the TOSA modules 204 include a laser arrangement that includes at least one laser diode device and supporting circuitry. Preferably, each TOSA module 204 includes a TO can laser/assembly that implements an EML laser arrangement, such as those discussed below with reference to FIGS. 3-5. The laser arrangements of the TOSA modules 204 can include other types including, for instance, distributed feedback lasers (DFBs), Vertical External-cavity Surface-emitting lasers (VECSEL) or other suitable laser devices.

Figure 3:
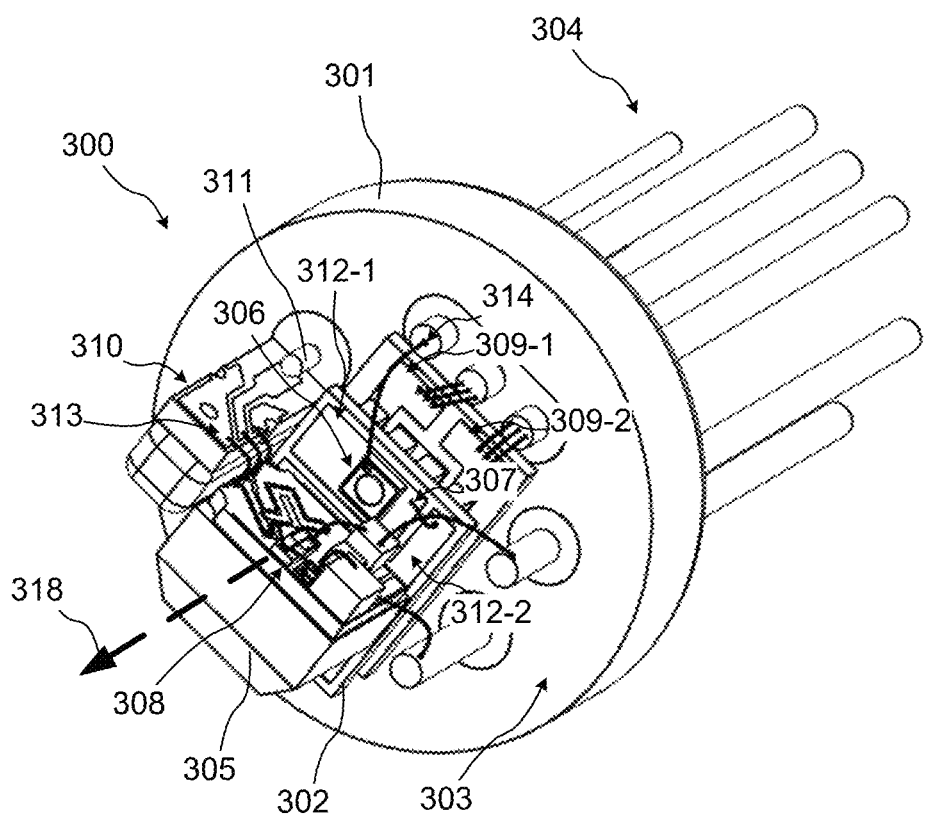
FIG. 3 is a perspective view of a laser assembly consistent with an embodiment of the present disclosure.

Turning to FIG. 3, an example laser assembly 300 is shown in accordance with an embodiment. The laser assembly 300 is suitable for use within the TOSA modules 204 described above and can be configured to emit at least one associated channel wavelength. As shown, the laser assembly 300 includes a TO-can form factor with a so-called "exposed" header, e.g., without a TO cap to provide a hermetic seal. However, this disclosure is not limited in this regard and aspects and features described in association with the laser assembly 300 can be utilized in a wide range of laser configurations and not necessarily only those that utilize TO can lasers. Likewise, while the following discussion specifically refers to an EML-type laser, this disclosure is not limited in this regard and other types of lasers are within the scope of this disclosure including, for example, distributed feedback laser diodes (DFBs), Distributed Bragg Reflex Lasers (DBRs), Vertical-Cavity Surface-Emitting Lasers (VCSELs), and Fabry-Perot Laser (FP lasers).

Continuing on, the laser assembly 300 includes a header 301 with a substantially cylindrical profile. The header 301 defines a mounting surface 303 for coupling to and supporting optical components, as will be discussed in further detail below. A plurality of electrical interconnects 304 extend through through-holes of the header 301 such that a first end of each electrical interconnect is proximate the mounting surface 303 and a second end is distal to the mounting surface 303. As shown, the electrical interconnects 304 are implemented as pins that allow for electrical coupling with the transmit connecting circuitry 206 (FIG. 2) via, for instance, a flexible printed circuit (FPC). Additional electrical interconnections, such as wire bonds 314, electrically couple optical components to the pins.

The electrical interconnects 304 can provide electrical connectivity with an external power rail and provide radio frequency RF driving signals to modulate an associated laser diode 308 and cause the same to emit channel wavelengths. The electrical interconnects 304 can directly couple, e.g., without an intermediate electrical interconnection such as a wire bond, with associated components. For instance, a PCB riser 310 coupled to the mounting surface 303 can include at least one electrically conductive trace that is configured to couple (directly) to a power rail pin 311. The PCB riser 310 advantageously allows for relatively short electrical interconnections with components, e.g., using wire bonds 313.

As further shown, a temperature control device 302 couples to the mounting surface 303 and provides at least first and second electrically conductive terminals 312-1, 312-2, respectively. The temperature control device 302 comprises top and bottom plates, and a plurality of semiconductor elements sandwiched between the top and bottom plate, as is discussed in further detail below.

In FIG. 3, the temperature control device 302 is implemented as a thermoelectric cooler (TEC) that thermally couples to the header 301 as a heatsink to communicate heat for dissipation purposes. The temperature control device 302 includes at least first and second terminals 309-1, 309-2, to electrically couple to external circuitry via electrical interconnects 304. The external circuitry can include a temperature controller (not shown) that can output a control signal (e.g., a DC signal) to regulate temperature of the laser assembly 300, and more specifically, to regulate the temperature of the laser diode 308 and other associated components. The temperature control device 302 can receive the control signal, e.g., via terminals 309-1, 309-2, and can introduce a temperature difference between the top and bottom plates, e.g., via the Peltier effect.

A submount 305 securely mounts to the temperature control device 302, and more specifically, to at least a portion of the second electrically conductive terminal 312-2. The submount 305 can be formed from an electrically conductive material such as copper, aluminum or other suitable material. The submount includes a laser arrangement comprising at least a laser diode 308 and supporting circuitry. The laser diode 308 may be implemented as an EML-type laser and have an emission surface that emits channel wavelengths along a light path 318, with light path 318 extending substantially transverse from the mounting surface 303.

Continuing on, a monitor photodiode (MPD) 306 is disposed on the first electrically conductive terminal 312-1. In the embodiment of FIG. 3, the MPD 306 includes a bottom or mating surface (not shown) having a cathode terminal coupled (directly) to the first electrically conductive terminal 312-1. Opposite the cathode terminal, the MPD 306 includes a top surface having an anode terminal. The anode terminal of the MPD 306 electrically couples to the electrical interconnects 304 via wire bond 314, although other interconnect devices may be utilized and this disclosure is not limited in this regard. Accordingly, the anode terminal of the MPD 306 can receive the first voltage potential and the cathode terminal of the MPD 306 can receive the second voltage potential, with the first voltage potential being less than the second voltage potential. For example, the first voltage potential can be 0 volts, e.g., ground, and the second voltage potential can measure about 3-5 volts, for example.

As shown in FIG. 3, the first and second electrically conductive terminals 312-1, 312-2 are electrically coupled via wire bond 307. The wire bond 307 can function as a jumper to electrically bridge the otherwise electrically isolated first and second electrically conductive terminals 312-1, 312-2. Thus, during operation of the laser assembly 300 the first and second electrically conductive terminals 312-1, 312-2 have the same/common voltage potential. As discussed above, this can include a 0 volt potential, e.g., a ground connection. The submount 305 can electrically couple to the ground connection to provide a ground plane for the associated laser arrangement. The submount 305 can also provide a thermal conduction path for heat to be communicated from the associated optical components, e.g., laser diode 308, to the temperature control device 302.

Figure 4:
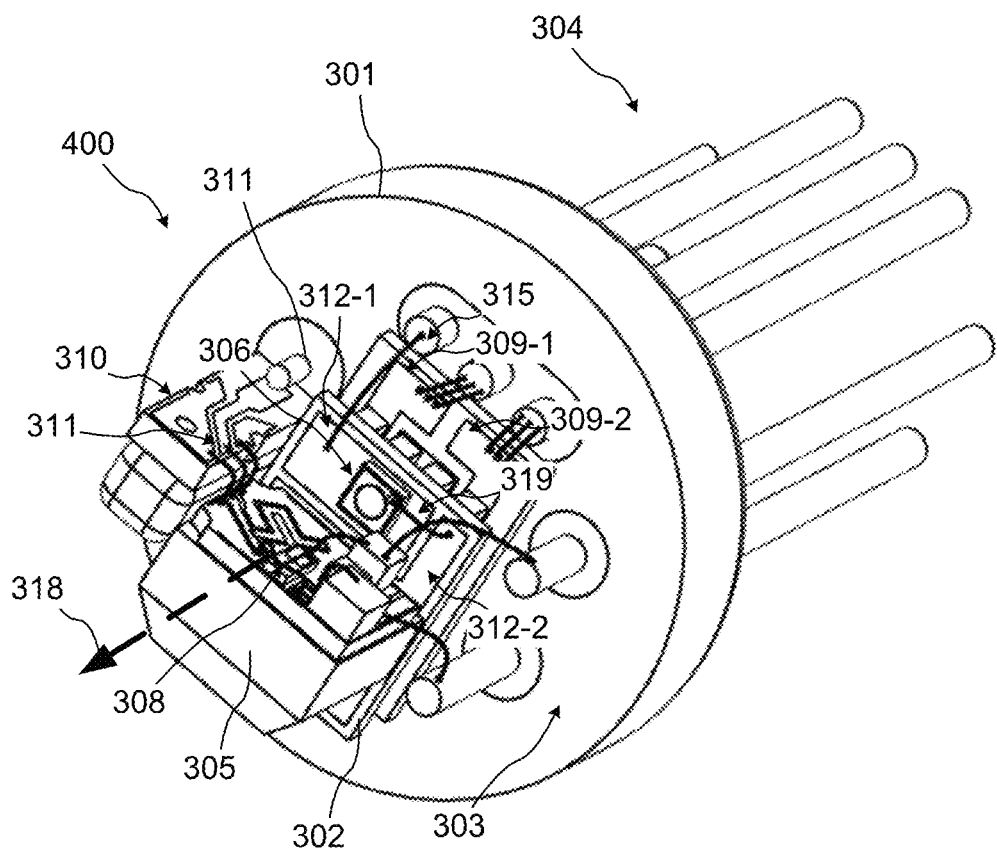
FIG. 4 is a perspective view of another laser assembly consistent with an embodiment of the present disclosure.

FIG. 4 shows another example of a laser assembly 400 consistent with the present disclosure. The laser assembly 400 may be configured substantially similar to that of the laser assembly 300 discussed above with reference to FIG. 3, the description of which will not be repeated for brevity. However, as shown in FIG. 4 the MPD 306 includes a cathode electrically coupled, e.g., directly, to the first electrically conductive terminal 312-1 to receive a first voltage potential. In addition, MPD 306 includes an anode terminal disposed opposite the cathode terminal and electrically coupled to receive a second voltage potential, the first voltage potential being greater than the second voltage potential.

In this example, the first electrically conductive terminal 312-1 couples to a positive voltage, e.g., 3.3V, via a power rail electrically coupled to pin 315. The second electrically conductive terminal 312-2 electrically couples to a ground connection via the PCB riser 310 and submount 305 to receive the second voltage potential. The submount 305 may therefore provide a ground plane and electrically communicate the second voltage potential to the second electrically conductive terminal 312-2 via, for instance, direct surface contact. The anode terminal of the MPD 306 electrically couples to the second electrically conductive terminal 312-2 to receive the second voltage potential via an electrical interconnect such as a wire bond 319 as shown in FIG. 4.

Accordingly, the temperature control device 302 advantageously provides up to two or more different voltage potentials based on providing a plurality of electrically isolated conductive terminals, e.g., first and second electrically conductive terminals 312-1, 312-2. Relatively simple jumpers can be selectively introduced, e.g., via wire bonding, to allow for the plurality of electrically conductive terminals to share a common voltage potential (e.g., as shown in FIG. 3). On the other hand, the electrically conductive terminals may also selectively supply two different voltage potentials by maintaining electrical isolation, e.g., as shown in FIG. 4. In this scenario, components such as the MPD 306 can receive the first voltage potential at a cathode terminal by mounting to the first electrically conductive terminal 312-1, and further receive the second voltage potential at the anode terminal by introducing an electrical interconnect, e.g., wire bond 319.

Figure 5:
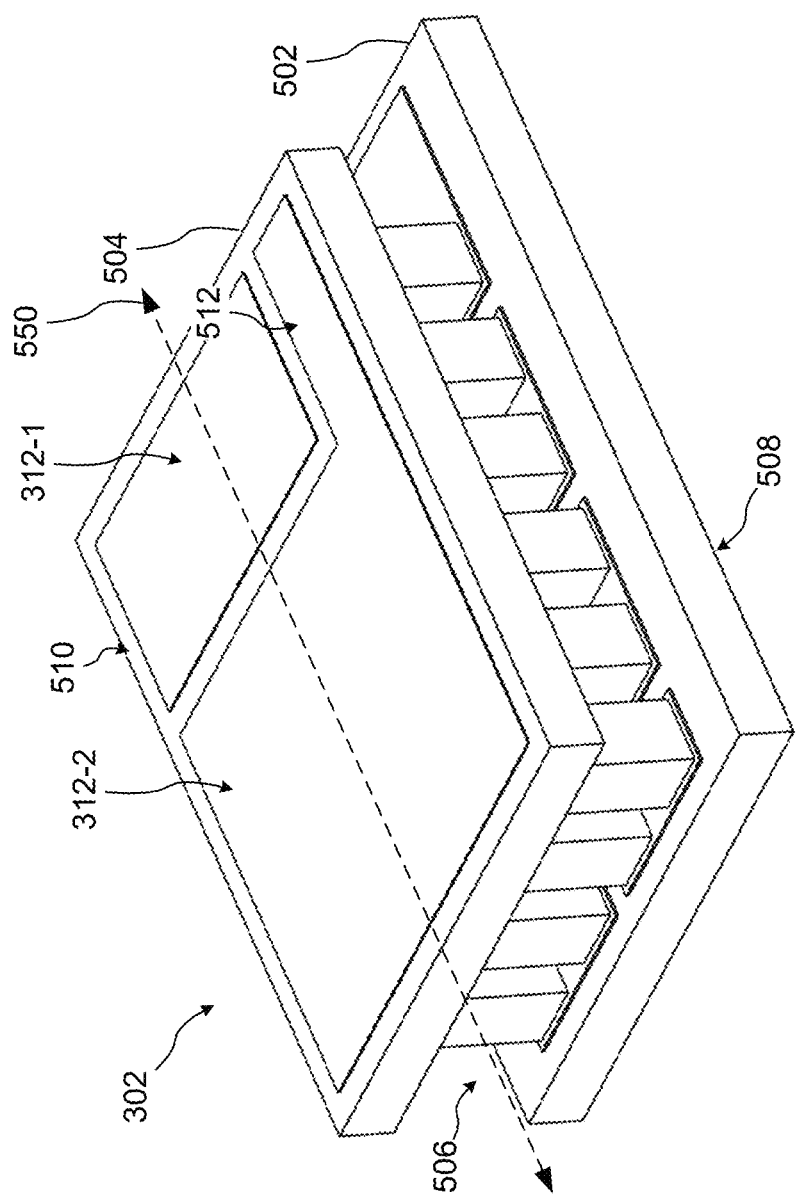
FIG. 5 shows an embodiment of a temperature control device suitable for use in the laser assemblies of FIGS. 3 and 4.

FIG. 5 shows an embodiment of the temperature control device 302 of FIGS. 3 and 4 in isolation. As shown, the temperature control device 302 includes a bottom (or first) plate 502, a top (or second) plate 504, and a plurality of semiconductor elements 506 sandwiched between the first and second plates 502, 504.

The bottom and top plates 502, 504 comprise the same or different materials. In an embodiment, the top and bottom plates 502, 504 comprise ceramic or other suitably thermally-conductive material. Some additional example materials include metal such as aluminum, copper, or any alloy thereof. The top and bottom plates 502, 504 can include a rectangular profile as shown, or can have other shapes/profiles depending on a desired configuration.

The semiconductor elements comprise an array of P and N-type elements. In an embodiment, the semiconductor elements comprise Peltier elements. In this embodiment, the semiconductor elements can be formed from Bismuth Telluride (BiTe) or other suitable materials. Preferably, the semiconductor materials are formed of an alloy selected from one or more of Bismuth (Bi), Tellurium (Te), Selenium (Se), and Antimony (Sb), with dopants to achieve a desired N or P type material.

In any event, the top and bottom plates 502, 504 include electrical pads, e.g., formed of copper, to form electrical junctions with plurality of semiconductor elements disposed therebetween.

The top plate 504 includes a component mounting surface 510, with the component mounting surface 510 facing opposite the mating surface 508 of the bottom plate 502. The component mounting surface 510 can include a pre-tin layer disposed thereon (not shown). The first and second electrically conductive terminals 312-1, 312-2 are disposed/formed on the component mounting surface 510. The first and second electrically conductive terminals 312-1, 312-2 can comprise copper, gold or any other suitably conductive metal/metal alloy.

As further shown, the first and second electrically conductive terminals 312-1, 312-2 are substantially coplanar, although other configurations are within the scope of this disclosure. The first electrically conductive terminal 312-1 includes an overall surface area that is less than the second electrically conductive terminal 312-2. Preferably, the first electrically conductive terminal 312-1 includes an overall surface area that is equal to or less than about a third of the overall surface area provided by the component mounting surface 510, and the second electrically conductive terminal 312-2 includes an overall surface area that is equal to or greater than half the overall surface area provided by the component mounting surface 510.

The second electrically conductive terminal 312-2 can include a profile that transitions from a wide section/region that extends substantially across the width of the top plate 504 to a relatively narrow section/region 512. The narrow section/region 512 can extend from the wider section/region along longitudinal axis 550. This profile allows the second electrically conductive terminal 312-2 to at least partially surround the first electrically conductive terminal 312-1 along at least two sides. This profile further allows for a relatively short interconnect, such as a wire bond, to electrically couple the first electrically conductive terminal 312-1 to the narrow section/region 512 when desired (e.g., see FIG. 3).

Thus, a temperature control device consistent with the present disclosure can be utilized in a wide-range of laser assembly configurations by providing one or more different voltage potentials. External power and driving circuitry, e.g., within an optical subassembly such as a transmitter optical subassembly (TOSA), can be implemented without the necessity of additional circuitry such as a negative voltage power rail to ensure proper operation of an MPD, for example. This significantly reduces design complexity and overall footprint of circuitry within an associated optical subassembly to drive a laser assembly.

In accordance with an aspect of the present disclosure a temperature control device for use in optical subassemblies is disclosed. The temperature control device comprising, a bottom plate to thermally couple to a heatsink, a top plate coupled to the bottom plate via a plurality of semiconductor elements disposed therebetween, the top plate defining a component mounting surface for coupling to at least first and second optical components, a first electrically conductive terminal disposed on the top plate to provide a first voltage potential, and a second conductive terminal disposed on the top plate to provide a second voltage potential, the first and second conductive terminals being isolated by a gap extending therebetween.

In accordance with another aspect of the present disclosure an laser assembly for use in an optical subassembly is disclosed. The laser assembly comprising a base having a mounting surface for coupling to at least one optical component, at least first and second electrical interconnects disposed adjacent the mounting surface to provide first and second voltage potentials, respectively, the first and second electrical interconnects to electrically couple to circuitry of the optical subassembly, a temperature control device coupled to the mounting surface and providing at least first and second electrically conductive terminals, the first and second electrically conductive terminals being electrically coupled to the first and second electrical interconnects, respectively, and a monitor photodiode disposed on the first electrically conductive terminal, the monitor photodiode having an anode or cathode electrically disposed on the first electrically conductive terminal to provide the first voltage potential to the anode or cathode, and the monitor photodiode having the other of the anode or cathode electrically coupled to the second electrically conductive terminal to provide the second voltage potential.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A temperature control device for use in optical subassemblies, the temperature control device comprising:
    a bottom plate to thermally couple to a heatsink;
    a top plate coupled to the bottom plate via a plurality of semiconductor elements disposed therebetween, the top plate defining a component mounting surface for coupling to at least first and second optical components;
    a first electrically conductive terminal disposed on the top plate to provide a first voltage potential; and
    a second conductive terminal disposed on the top plate to provide a second voltage potential, the first and second conductive terminals being isolated by a gap extending therebetween;
    wherein the first and second electrically conductive terminals are configured to thermally couple to the heatsink by way of at least the top plate, the plurality of semiconductor elements, and the bottom plate;
    wherein a first thermal communication path extends from the first electrically conductive terminal to the heatsink, and a second thermal communication path extends from the second electrically conductive terminal to the heatsink.

2. The temperature control device of claim 1, wherein the first and second electrically conductive terminals are substantially coplanar with each other.

3. The temperature control device of claim 1, wherein the first and second electrically conductive terminals are electrically isolated from each other by the gap.

4. The temperature control device of claim 1, wherein the first optical component comprises a monitor photodiode, and wherein the monitor photodiode includes an associated anode terminal or cathode terminal electrically coupled to the first electrically conductive terminal to receive a voltage having the first voltage potential.

5. The temperature control device of claim 1, wherein the second optical component comprises a laser arrangement, the laser arrangement comprising a laser diode, and wherein the laser diode is electrically coupled to the second electrically conductive terminal.

6. The temperature control device of claim 1, wherein the second electrically conductive terminal provides a ground plane.

7. The temperature control device of claim 1, wherein the first and second electrically conductive terminal provide the same voltage potential.

8. The temperature control device of claim 7, wherein the first and second electrically conductive terminals are electrically coupled together by a wire bond to provide the same voltage potential.

9. The temperature control device of claim 1, wherein the first electrically conductive terminal has an overall surface area that is less than the overall surface area of the second electrically conductive terminal.

10. The temperature control device of claim 1, wherein the first plate includes electrical terminals to receive an electrical signal to induce electrical current across the semiconductor elements.

11. The temperature control device of claim 1, wherein the second electrically conductive terminal at least partially surrounds the first electrically conductive terminal.

12. A laser assembly for use in an optical subassembly, the laser assembly comprising:
    a base having a mounting surface for coupling to at least one optical component;
    at least first and second electrical interconnects disposed adjacent the mounting surface to provide first and second voltage potentials, respectively, the first and second electrical interconnects to electrically couple to circuitry of the optical subassembly;
    a temperature control device coupled to the mounting surface and providing at least first and second electrically conductive terminals, the first and second electrically conductive terminals being electrically coupled to the first and second electrical interconnects, respectively; and
    a monitor photodiode disposed on the first electrically conductive terminal, the monitor photodiode having an anode or cathode electrically disposed on the first electrically conductive terminal to provide the first voltage potential to the anode or cathode, and the monitor photodiode having the other of the anode or cathode electrically coupled to the second electrically conductive terminal to provide the second voltage potential.

13. The laser assembly of claim 12, wherein the base comprises a TO can header, and the first and second electrical interconnects comprise pins that extend from the TO can header.

14. The laser assembly of claim 12, wherein the first electrically conductive terminal of the temperature control device has an overall surface area that is less than the second electrically conductive terminal.

15. The laser assembly of claim 12, wherein the first and second voltage potentials provided by the first and second electrically conductive terminals, respectively, are different.

16. The laser assembly of claim 12, wherein the temperature control device includes a bottom plate to thermally couple to the mounting surface and a top plate coupled to the bottom plate via a plurality of semiconductor elements disposed therebetween.

17. The laser assembly of claim 16, wherein the first and second electrically conductive terminals are configured to thermally couple to the mounting surface by way of at least the top plate, the plurality of semiconductor elements, and the bottom plate.

18. The laser assembly of claim 12, wherein a first thermal communication path extends from the first electrically conductive terminal to the mounting surface, and a second thermal communication path extends from the second electrically conductive terminal to the mounting surface.

* * * * *